Dec. 22, 1964 M. D. AASEN ETAL 3,162,814
FREQUENCY BASE AGC
Filed Feb. 12, 1960
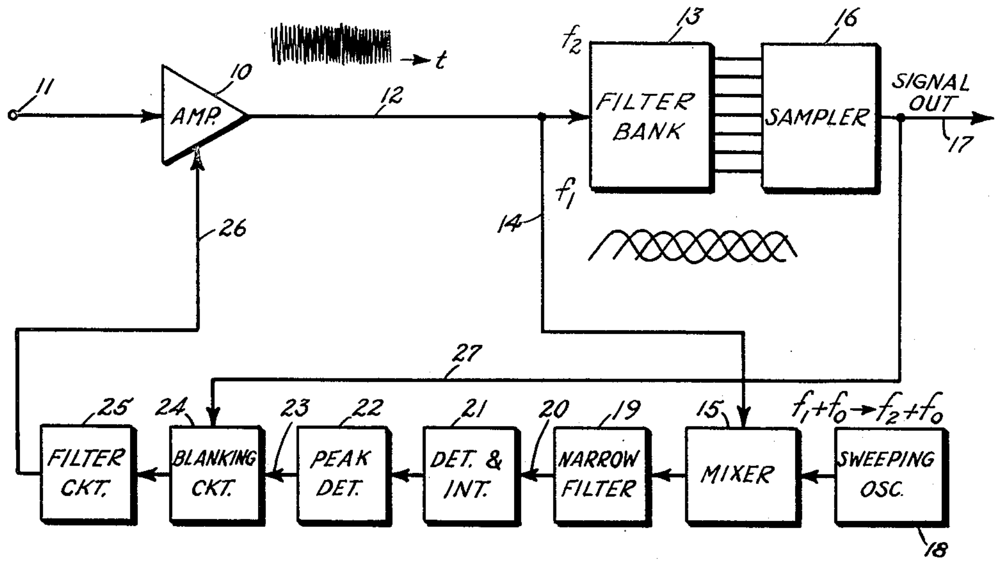
INVENTOR.
MARVIN D. AASEN
GEORGE R. HETRICH
BY
H. H. Losche
ATTORNEYS 3,162,814

FREQUENCY BASE AGC

Marvin D. Aasen, Glen Burnie, and George R. Hetrick, Severna Park, Md., assignors, by mesne assignments, to the United States of America as represented by the Secretary of the Navy Filed Feb. 12, 1960, Ser. No. 8,470
8 Claims. (Cl. 325—478)

This invention relates to automatic amplifier gain control circuits and more particularly to a frequency base automatic gain control circuit in which a constant background noise level is provided on a frequency spectrum basis rather than on a time basis.

Present automatic gain control circuits of pulse Doppler radar devices, or the like, utilize a filter bank as the frequency base and a commutating type of sampling system to sample the amplitude variation at the filter outputs to develop an automatic gain control voltage. The output of some samplers indicate only "Yes-No" output of which there is no amplitude discrimination.

In the persent invention an amplifier is used for amplifying intelligence signals such as target echo signals which may be cluttered with jam or noise signals and the amplified signals are applied to a filter bank. The filter bank provides a plurality of filter channels which are sampled by means of, for example; a commutating type sampling means to select out the intelligence signals by virtue of repeated sampling. The amplified output is also fed to a mixer circuit for mixing the intelligence and jam or noise signals with sweeping frequencies from a sweeping oscillator which oscillator is capable of producing sweeping frequencies over the same frequency range as the filter bank. A narrow bandpass filter on the output of the mixer produces a frequency signal, the amplitude of which will be dependent on the noise strength at a given frequency and the variations of amplitude in time will correspond to the narrow bandpass filter passing over the frequency spectrum. The narrow bandpass filter in effect sweeps the frequency spectrum by virtue of the sweeping oscillator mixing sweeping voltages with the intelligence and noise signals from the amplifier. This frequency signal is detected and integrated to produce a direct-current control voltage which is applied to the control circuits of the amplifier to control the amplification gain of the amplifier inversely proportional to noise strength to provide a constant background noise level. The circuit from the mixer to the amplifier producing the amplifier control voltage is interruptible by a blanking circuit under the control of the sampler output whereupon the amplifier control voltage is blanked or cut off upon the occurrence of an intelligence signal on the sampler output. In this manner gain control of the amplifier is on a frequency basis rather than a time basis whereby a high signal-to-noise ratio may be maintained for the sampler output. It is therefore a general object of this invention to provide a frequency base automatic gain control circuit to obtain a constant background noise level on a frequency spectrum basis rather than a time basis on the output of the amplifier and filter sampler circuit.

Other objects, advantages, features and uses may become more apparent to those skilled in the art when considered along with the single illustration of drawing showing the invention in block circuit diagram.

Referring to the figure of drawing, an amplifier 10 is shown having an input from a terminal source 11 which is adapted to receive intelligence and noise or jam signals as from a pulse Doppler radar receiver, or the like. Amplifier 10 is coupled by conductor means 12 to a filter bank 13 and through a branch conductor means 14 to a mixer 15. The filter bank provides filter channels in a range of frequencies from $f1$ to $f2$. The filter bank 13 is sampled by a sampler circuit 16 as by commutation or other switching arrangements well understood by those skilled in the art in the sampling of filter banks. The sampled output is by way of conductor means 17 to a point of use of the intelligence signals applied to the amplifier circuit 10.

Another input to the mixer circuit 15 is from a sweeping oscillator 18 which sweeps in frequency from $f1+f0$ to $f2+f0$ where $f1$ and $f2$ are the lower and upper frequencies of the filter bank 13 and $f0$ is the center frequency of a narrow bandpass filter 19 coupled to the output of mixer circuit 15. The effect of the sweeping oscillator of generating sweeping frequencies from $f1+f0$ to $f2+f0$ and mixing the output of the sweeping oscillator 18 with the intelligence and noise signals coming from amplifier 10 by way of the conductor means 14 in the mixer circuit 15 is substantially the same as the effect of the narrow band filter 19 sweeping over the entire frequency range or spectrum of the filter bank 13 from which is produced a frequency signal on an output 20 of the narrow filter circuit 19 of an amplitude proportional to the noise or jam signal strength. This frequency signal is detected and integrated in a detector and integrator network 21 and thereafter peak detected by a peak detector 22 to produce a direct-current control voltage of an amplitude or voltage level dependent on the noise strength in a narrow frequency band coming from the output of the amplifier 10 over the conductor 14 to the mixer 15. The center frequency of the narrow frequency band is swept periodically across the frequency band $f1$ to $f2$ by the sweeping oscillator 18. The direct-current control voltage is conducted by way of an output conductor means 23 from the peak detector 22 through a blanking circuit 24 and a filter circuit 25 to the biasing control circuit of the amplifier 10 by way of the conductor means 26. The blanking cricuit 24 is controlled in its gating or blanking operation from the output 17 of the sampler circuit 16 by way of conductor means 27. Upon the occurrence of an intelligence signal appearing on the output 17 of the sampler circuit 16, this intelligence signal voltage will likewise be applied through conductor 27 to the blanking circuit 24 to blank or cut off any direct-current control voltage applied to amplifier 10 to allow the intelligence signals as well as the noise and jam signals to be amplified for the filter bank. In this case the signal-to-noise ratio is acceptable as, for example, greater than one.

The amplifier 10 may be any type well understood in the art which may be bias controlled to control the gain factor of the amplifier. The filter bank and the sampler circuit may be of any type well understood in the art capable of channeling and sampling the several filter bank channels to select the frequency channel having intelligence signals appearing therein for passage to downstream circuitry by way of conductor 17. The filter bank 13 and sampler circuit 16 may be of the types such as commutation or sequentially switched devices to consecutively sample each chanel of frequency over the range of frequency $f1$ to $f2$. The sweeping oscillator 18, mixer circuit 15, filter circuits 19 and 25, the detector and integrating, and the blanking networks, may be of a conventional type and form no part of this invention as items per se whereupon none of the circuits or networks will be specifically described.

In the operation of this circuit, let it be assumed for the purpose of example that intelligence signals in which there are super-imposed thereon a plurality of noise or jam signals are applied to the terminal input 11 of amplifier 10. These intelligence and noise signals may come from a radar receiver for ranging or detecting targets, or from any other source where noise or jam clutter occurs in the frequency range of intelligence signals to be received.

The amplifier 10 will amplify both the intelligence and noise signals and apply them to the filter bank where the signals will be channeled as to their frequency band in a plurality of filter circuits in the filter bank 13. Filter bank 13 has the filters thereof repeatedly sampled in sequence by the sampler circuit 16 such that the intelligence signals are selected by reoccurrence of signals at the same frequency and the signals are conducted over the output 17. Without any noise suppression whatsoever noise signals would likewise be conducted into the filter bank and would saturate same to clutter the actual intelligence signals sought out and produce a very low signal-to-noise ratio which may destroy the very purpose of intelligence signal detection. In the operation of this invention the amplified output of noise and intelligence signals is applied to the mixer circuit 15 which is mixed with frequency oscillations from the sweeping oscillator 18 to sweep over the entire frequency range coincident with the capabilities of the filter bank 13. The narrow band filter 19 effectively sweeping over the frequency spectrum of the filter bank and being responsive to the coincidence of any noise frequency with the frequency from the sweeping oscillator will produce a frequency signal corresponding to the intermediate frequency $f0$ of the narrow filter 19 on the output 20. This frequency signal will be detected and integrated by the detector and integrator circuit 21 to rectify and average the frequency signal. The integrated direct-current voltage signal coming from the detector and integrator circuit 21 is peak detected in the peak detector circuit 22 to produce a substantially constant direct-current control voltage on the output 23 which is passed through the blanking circuit 24 and further filtered in the filter circuit 25 for application as a direct-current control voltage over the conductor 26 to the bias control circuit (not shown) in the amplifier 10. The filter circuit 25 further smooths the direct current control voltage to obtain good amplification response. The occurrence of the direct-current control voltage over the conductor 26 reduces the gain of the amplifier 10 thereby reducing amplification of any noise frequency signals applied to the amplifier 10 by way of conductor 11 to a constant background level. When the intelligence signals are strong at a particular frequency that is, have a signal-to-noise ratio that is tolerable, for example, greater than one, these intelligence signals will be selected at the sampler circuit 16 conducted on the output 17 which output signals will be applied to the blanking circuit 24 to blank out or cut off the control voltage over conductor 26 to the amplifier 10 whereupon high gain amplification is achieved when intelligence signals are present or passing through the amplifier and filter circuit. When the noise strength is high which would produce clutter frequencies, a control voltage will be produced in the mixer and detector circuit through the conductor 26 to the amplifier 10 to reduce amplifier gain during the period of high noise strength. By this means the signal-to-noise ratio will be maintained high so that the output 17 of the sampler circuit 16 will always have a high intelligence signal component for use in subsequent or downstream circuitry for radar indication, tracking circuits, or the like.

While many modifications and changes may be made in the control circuit details or arrangement of components of this invention, it is to be understood that we desire to be limited in scope only by the accompanying claims.

We claim:

1. In a circuit combination of a high gain amplifier and a sampled filter bank for amplifying and filtering applied noise and intelligence signals, the invention which comprises: means mixing the amplifier output with sweeping frequency oscillations and narrow band filtering the mixed frequencies to produce a frequency signal, the amplitude of which is proportional to the noise signal frequency strength; circuit means converting said frequency signal to a smooth direct-current signal and applying same to said amplifier as a control voltage, said control voltage being of a polarity to inversely control the gain thereof; and a blanking circuit in said circuit means coupled to the output of said sampled filter bank for blanking out said direct-current signal to said amplifier upon the occurrence of signal intelligence at said sampled filter circuit output whereby intelligence signals are amplified and noise signals are suppressed to a constant background level to provide a high signal-to-noise ratio.

2. In a circuit combination as set forth in claim 1 wherein said circuit means converting said frequency signal includes a detector and integrator network, said blanking circuit, and a filter circuit, in that order from said mixing means to said amplifier.

3. In a circuit combination as set forth in claim 2 wherein said circuit means further includes a peak detector between said detector and integrator network and said blanking circuit whereby only noise signals of a strength to interfere with said intelligence signals are applied to control said amplifier gain.

4. In a circuit combination of a high gain amplifier and a sampled filter bank for amplifying and filtering received noise and intelligence signals, the invention which comprises: a sweep oscillator for generating sweep oscillations in a frequency range coextensive with the range of frequencies filtered by said filter bank; mixer means coupled to mix the sweep oscillations of said sweep oscillator and said noise and intelligence signals from said amplifier; narrow band filter means coupled to the output of said mixer effectively sweeping the frequency spectrum of said filter bank to produce a frequency signal on the output thereof at an amplitude proportional to the noise signal frequency strength; and circuit means coupled to said narrow band filter output for converting said frequency signal to a direct-current control voltage and applying same to said amplifier for controlling the gain inversely thereof whereby control voltages are produced in proportion to noise signal strength to reduce amplifier gain inversely to noise signal strength.

5. In a circuit combination as set forth in claim 4 wherein said circuit means includes a detecting and integrating network, a blanking circuit, in that order between said narrow band filter and said amplifier, said narrow band filter band passing a signal frequency of an amplitude in proportion to the strength of noise signals mixed with sweep oscillations of complementary frequencies, and said blanking network being coupled to the output of said sampled filter bank to blank said circuit means when an intelligence signal is present.

6. In a circuit combination of a high gain amplifier and a sampled filter bank for amplifying and sampling the filter bank for intelligence signals of applied intelligence signals including noise signals, the invention which comprises: a sweeping oscillator for generating oscillations in a frequency range coextensive with the frequency range of the filter bank; a narrow band filter; a mixer coupled to the outputs of said amplifier and said sweeping oscillator with the output thereof coupled to said narrow band filter producing a frequency signal on the output thereof, the amplitude of which will be dependent on the noise signal strength at a given frequency; a detector and integrator network and a peak detector network serially coupled in that order from said narrow band filter output for rectifying and integrating said frequency signal and for detecting the peaks of same and producing a direct-current control voltage on the output thereof; a filter circuit; a blanking circuit coupling the output of said peak detector network and said filter circuit, said blanking circuit being coupled to the output of said sampled filter bank to control cutoff of the control voltage to said filter circuit; and means coupling the output of said filter circuit to said amplifier to control the gain inversely of the latter whereby the control voltage is produced to control gain of the amplifier inversely to noise signal strength and the control voltage is removed for strong intelligence signals.

7. A frequency base automatic gain control circuit comprising: an amplifier means for amplifying noise and intelligence signals; a filter bank coupled to said amplifier means for receiving said noise and intelligence signals; a sampling network coupled to said filter bank for sampling the filters of said filter bank; a mixer having means mixing the output of said amplifier means with frequency signals of a bandwidth of said filter bank and narrow band filtering said mixed frequencies to produce a frequency signal; means converting said frequency signal to direct-current and applying same to said amplifier to control the gain thereof inversely to noise signal strength.

8. A frequency base automatic gain control circuit comprising: a high gain amplifier for amplifying noise and intelligence signals; a filter bank coupled to the output of said amplifier for filter channeling the noise and intelligence signals; a sampling network coupled to sequentially sample each filter channel; a sweeping oscillator; a mixer coupled to the outputs of said amplifier and sweeping oscillator to mix the sweeping oscillations with the noise and intelligence signals producing a mixed frequency signal spectrum on the output thereof of an amplitude proportional to the noise signal frequency strength;

a narrow band filter coupled to the output of said mixer for effectively sweeping the spectrum of said mixed frequencies to produce a frequency signal; detector and integrating means coupled to receive the narrow band filter output frequency signal and rectifying and peak detecting same into a direct-current control voltage of an amplitude corresponding to the noise signal frequency strength; a filter circuit and a blanking circuit serially coupling the detector and integrating means to said amplifier to conduct said direct current control voltage to said amplifier to control amplification inversely to control voltage amplitude, said blanking circuit being coupled to the sampling network output to blank said control voltage upon the occurrence of a sampled intelligence signal whereby the signal-to-noise ratio is maintained high under all conditions of varying noise levels.

References Cited by the Examiner

UNITED STATES PATENTS 2,616,971 11/52 Kannenberg ---------- 330—135

DAVID G. REDINBAUGH, *Primary Examiner.*

FRED M. STRADER, *Examiner.*